US010700274B2

(12) United States Patent
Cohen

(10) Patent No.: US 10,700,274 B2
(45) Date of Patent: Jun. 30, 2020

(54) PLANAR SINGLE-CRYSTAL PHASE CHANGE MATERIAL DEVICE

(71) Applicant: International Business Machines Corporation, Armonk, NY (US)

(72) Inventor: Guy Cohen, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/151,738

(22) Filed: Oct. 4, 2018

(65) Prior Publication Data

US 2020/0111955 A1    Apr. 9, 2020

(51) Int. Cl.
*H01L 45/00* (2006.01)
*H01L 27/24* (2006.01)
*G11C 11/56* (2006.01)
*G11C 13/00* (2006.01)

(52) U.S. Cl.
CPC ...... *H01L 45/1226* (2013.01); *G11C 11/5678* (2013.01); *G11C 13/0004* (2013.01); *H01L 27/2436* (2013.01); *H01L 27/2463* (2013.01); *H01L 45/06* (2013.01); *H01L 45/065* (2013.01); *H01L 45/126* (2013.01); *H01L 45/1273* (2013.01); *H01L 45/1293* (2013.01); *H01L 45/1641* (2013.01)

(58) Field of Classification Search
CPC .......... H01L 45/1273; G11C 11/5678
See application file for complete search history.

(56) References Cited

U.S. PATENT DOCUMENTS

| 7,888,165 B2 | 2/2011 | Hampton |
| 8,319,203 B2 | 11/2012 | Hampton |
| 8,828,785 B2 | 9/2014 | Cohen et al. |
| 8,907,316 B2 | 12/2014 | Lung et al. |
| 2007/0160760 A1 | 7/2007 | Shin et al. |
| 2008/0191187 A1* | 8/2008 | Lung .................. G11C 13/0004 257/4 |

(Continued)

OTHER PUBLICATIONS

Jun-Young Lee et al., "Atomic Migration Induced Crystal Structure Transformation and Core-Centered Phase Transition in Single Crystal Ge2Sb2Te5 Nanowires," Nano letters, vol. 16, No. 10, 2016, pp. 6078-6085.

(Continued)

*Primary Examiner* — Farun Lu
(74) *Attorney, Agent, or Firm* — Cantor Colburn LLP; Vazken Alexanian

(57) ABSTRACT

A method of fabricating a phase change material (PCM) device is provided. The method includes disposing a dielectric layer above or below a PCM layer and disposing first and second contacts in a same plane within the dielectric layer with the first contact having a larger contact area than the second contact. The method also includes one of directing a short current pulse from the first contact to the second contact so as to form amorphous-PCM in a region of the PCM layer adjacent to the second contact with crystalline-PCM partially surrounding and in contact with the amorphous-PCM and directing a long current pulse from the first contact to the second contact so as to form crystalline-PCM in the region of the PCM layer adjacent to the second contact.

16 Claims, 7 Drawing Sheets

(56) References Cited

U.S. PATENT DOCUMENTS

| | | | | |
|---|---|---|---|---|
| 2010/0276654 | A1* | 11/2010 | Chen | H01L 45/06 |
| | | | | 257/2 |
| 2010/0295123 | A1* | 11/2010 | Lung | H01L 27/101 |
| | | | | 257/334 |
| 2011/0108792 | A1 | 5/2011 | Lam et al. | |
| 2014/0070155 | A1* | 3/2014 | Cohen | H01L 45/06 |
| | | | | 257/2 |
| 2014/0376149 | A1* | 12/2014 | Lamorey | H05B 3/023 |
| | | | | 361/280 |
| 2018/0033962 | A1 | 2/2018 | Redaelli et al. | |

OTHER PUBLICATIONS

Philipp Urban et al., "Temperature dependent resonant X-ray diffraction of single-crystalline Ge2Sb2Te5," CrystEngComm, vol. 15, No. 24, 2013, pp. 4823-4829.

Wolfgang Braun et al., "Epitaxy of Ge—Sb—Te phase-change memory alloys," Applied Physics Letters, vol. 94, No. 4, 2009, 041902, 3 pages.

* cited by examiner

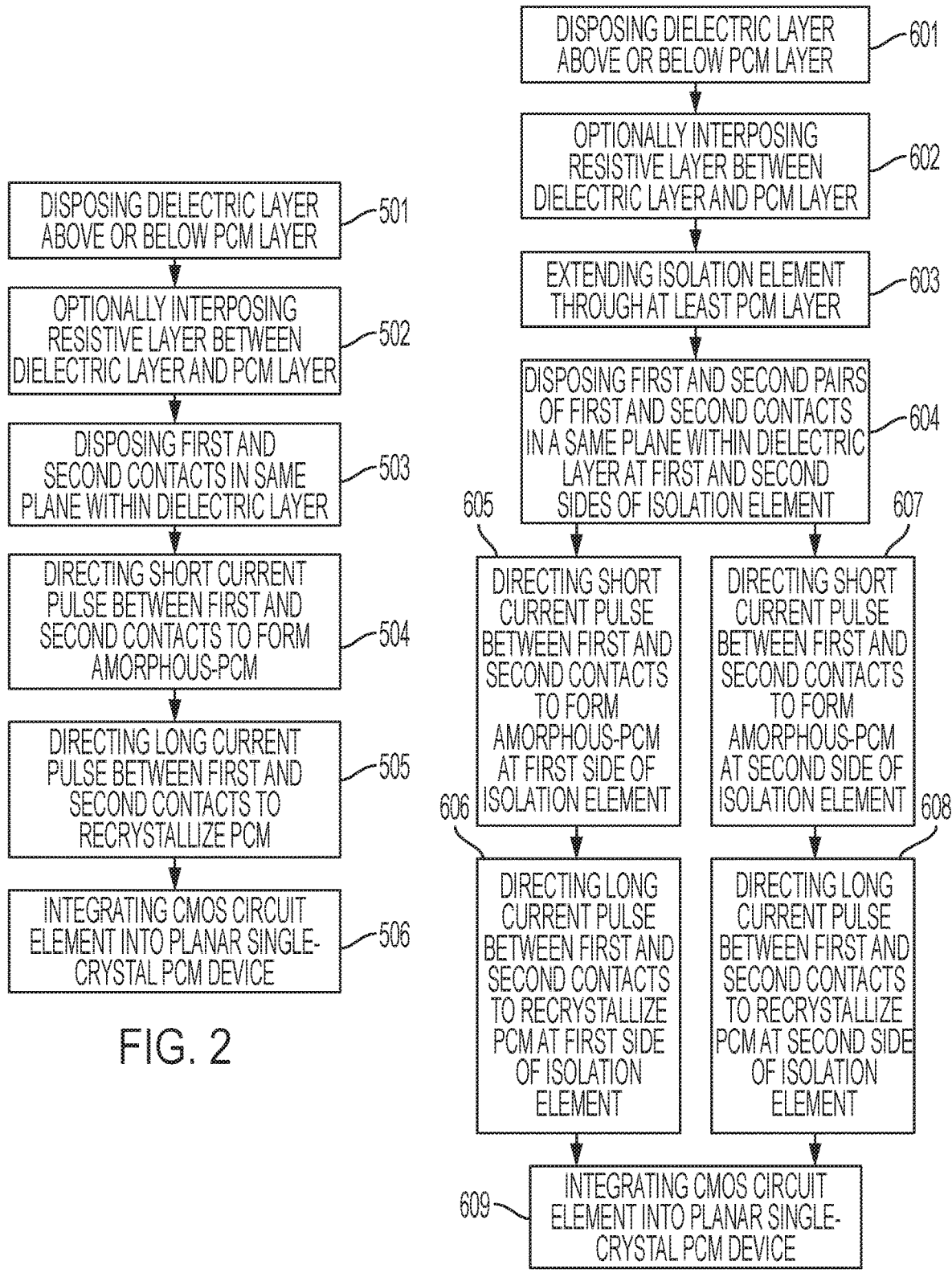

PLANAR SINGLE-CRYSTAL PHASE CHANGE MATERIAL DEVICE

BACKGROUND

The present invention generally relates to fabrication methods and resulting structures for semiconductor devices. More specifically, the present invention relates to a planar single-crystal phase change material (PCM) device.

Phase-change materials, such as chalcogenides, can be switched between two states, poly-crystalline and amorphous, based on heat produced by the passage of an electric current. In the poly-crystalline state, each grain of the material is a perfect crystal and the material is conductive (almost metallic). It is notable however that each of the grains is randomly oriented with respect to the other grains resulting in an overall poly-crystalline material. In the amorphous state, there is no long range order in the material and the material is highly resistive. These two states make phase-change materials particularly well-suited for storing data.

To change the phase change material from the amorphous to the poly-crystalline state the material is heated above its crystallization temperature for a sufficiently long time. It will arrange itself into a poly-crystalline state during that heating time. To change the material from the poly-crystalline state to the amorphous state it will be heated above its melting temperature and then quenched (quickly cooled). It will not have enough time to rearrange itself in an ordered state, and an amorphous state will result. Both the crystallization temperature and melting temperature vary depending on the particular phase change material.

SUMMARY

Embodiments of the present invention are directed to a method of fabricating a phase change material (PCM) device. A non-limiting example of the method includes disposing a dielectric layer above or below a PCM layer and disposing first and second contacts in a same plane within the dielectric layer with the first contact having a larger contact area than the second contact. The method also includes one of directing a short current pulse from the first contact to the second contact so as to form amorphous-PCM in a region of the PCM layer adjacent to the second contact with crystalline-PCM partially surrounding and in contact with the amorphous-PCM and directing a long current pulse from the first contact to the second contact so as to form crystalline-PCM in the region of the PCM layer adjacent to the second contact.

Embodiments of the present invention are directed to a phase change material (PCM) device. A non-limiting example of the planar single-crystal PCM device includes a substrate, a PCM layer disposed on the substrate, a dielectric layer disposed over the PCM layer and first and second contacts disposed in a same plane within the dielectric layer with the first contact having a larger contact area than the second contact. The PCM layer includes one of amorphous-PCM in a PCM layer region adjacent to the second contact and crystalline-PCM surrounding and in contact with the amorphous-PCM following a short current pulse being directed from the first contact to the second contact and crystalline-PCM in the PCM layer region following a long current pulse being directed from the first contact to the second contact.

Embodiments of the invention are directed to a phase change material (PCM) device. A non-limiting example of the planar single-crystal phase change material (PCM) device includes a substrate, a dielectric layer disposed over the substrate, first and second contacts disposed in a same plane within the dielectric layer with the first contact having a larger contact area than the second contact and a PCM layer disposed over the dielectric layer. The PCM layer includes one of amorphous-PCM in a PCM layer region adjacent to the second contact and crystalline-PCM surrounding and in contact with the amorphous-PCM following a short current pulse being directed from the first contact to the second contact, and crystalline-PCM in the PCM layer region following a long current pulse being directed from the first contact to the second contact.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 is a flow diagram illustrating a method of fabricating a planar single-crystal phase change material device in accordance with embodiments of the present invention;

FIG. 3 is a flow diagram illustrating a method of fabricating a planar single-crystal phase change material device in accordance with further embodiments of the present invention;

Figure 1A:
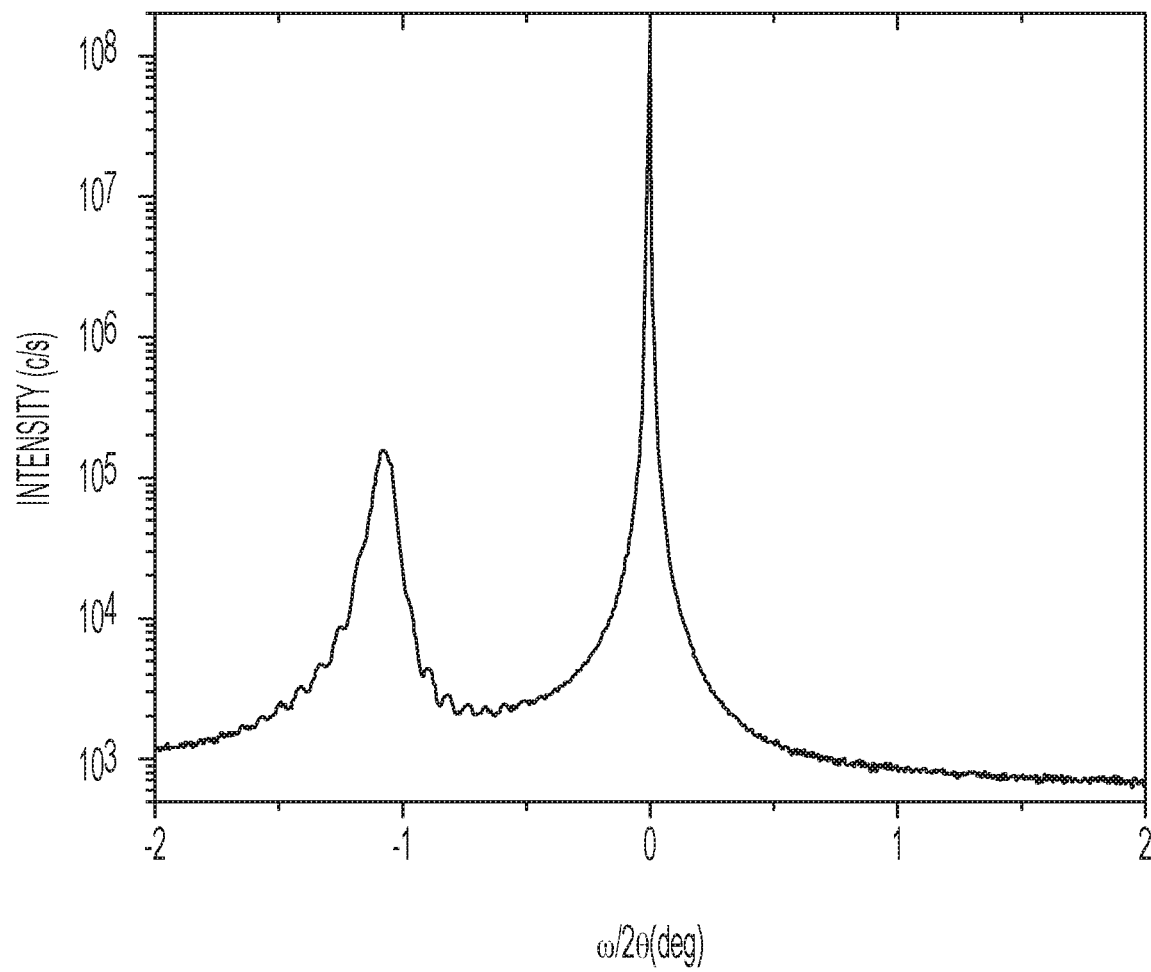
FIG. 1A is an high-resolution x-ray diffraction measurement for a first exemplary single-crystal phase change material, antimony telluride (Sb2Te3) according to an embodiment of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a polycrystalline state of phase change material (PCM) is made up of many small crystals. The crystals themselves are not correlated from one grain of the material to another. Nevertheless, each of the grains is a crystal, and thus these terms are being used synonymously herein. One important difference in the grain properties is their orientation. There is also a size distribution (i.e., each grain can have a different size). The shape of grains can also be different. Thus, variability throughout the material commonly exists.

When a memory array is produced, the material is often divided into memory cells with each cell representing a bit. If the volume of material allocated to each cell (bit) is large, variability is not a major concern. Each bit will contain many grains and the bit properties will be determined by average characteristics over many grains. As a result, large cells will be operationally similar to one another. By comparison, if the volume of the cells is small, then the variability in grain properties can have a significant impact on device operability. Namely, if each cell captures 1 or 2 grains (or even just a fraction of a grain), then variability in the grains can have a significant impact on the bit properties of the cell because the bit properties are no longer averaged over many grains as was the case in a large volume cell. In particular, grain differences can affect properties of the material, such as its resistivity.

As memory technology evolves, the volume of phase change material allocated for each bit is shrinking to allow for more data storage (more bit cells). The shrinking size of the memory cell therefore requires that the issue of variability among grains be addressed.

As provided above, variability in the crystal structure of PCMs can be problematic when the volume of the material allocated for a bit is small, such as in the case of device scaling. Thus, production of a single-crystal PCM (i.e., a PCM that has the same crystal structure anywhere throughout the film) can be advantageous.

Figure 1B:
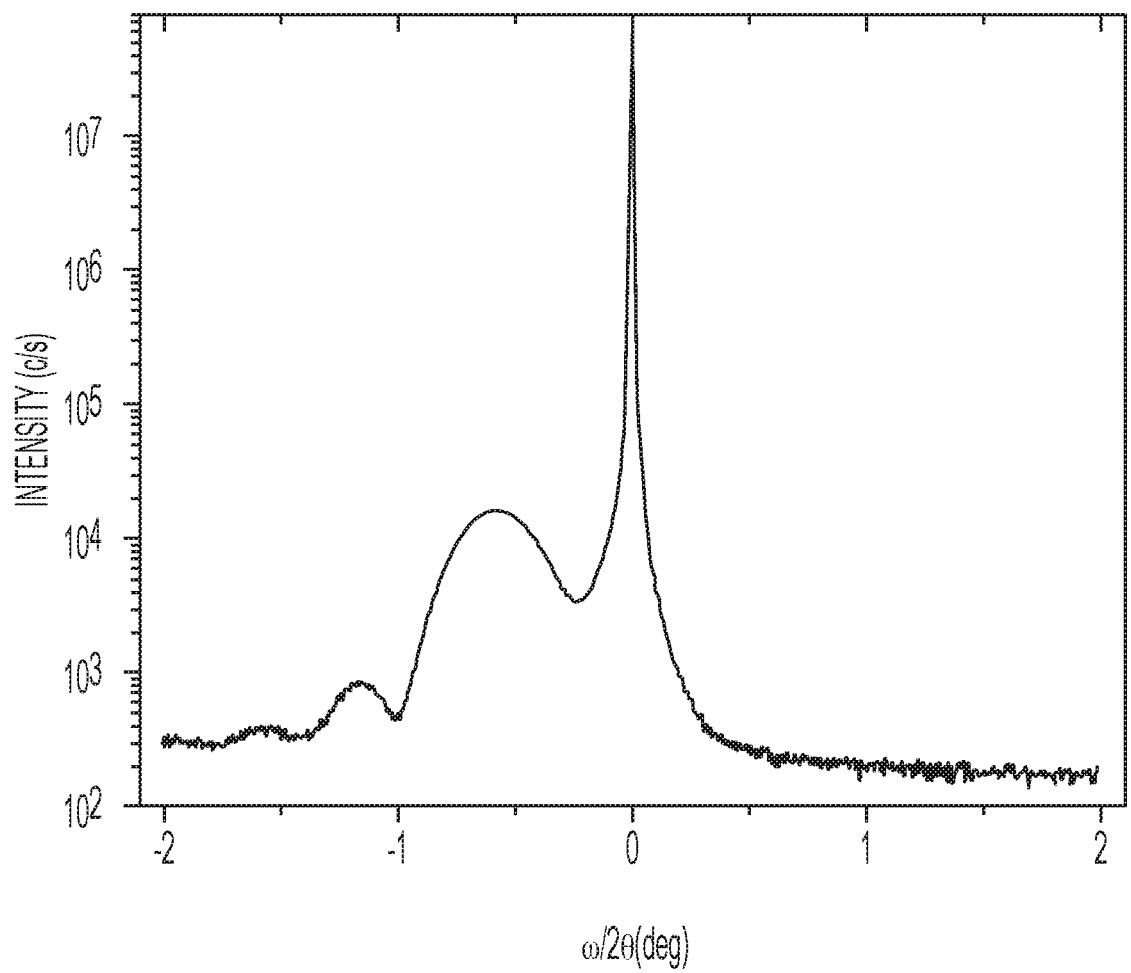
FIG. 1B is an high-resolution x-ray diffraction measurement for a second exemplary single-crystal phase change material, germanium telluride (GeTe) according to an embodiment of the present invention.
Figure 1C:
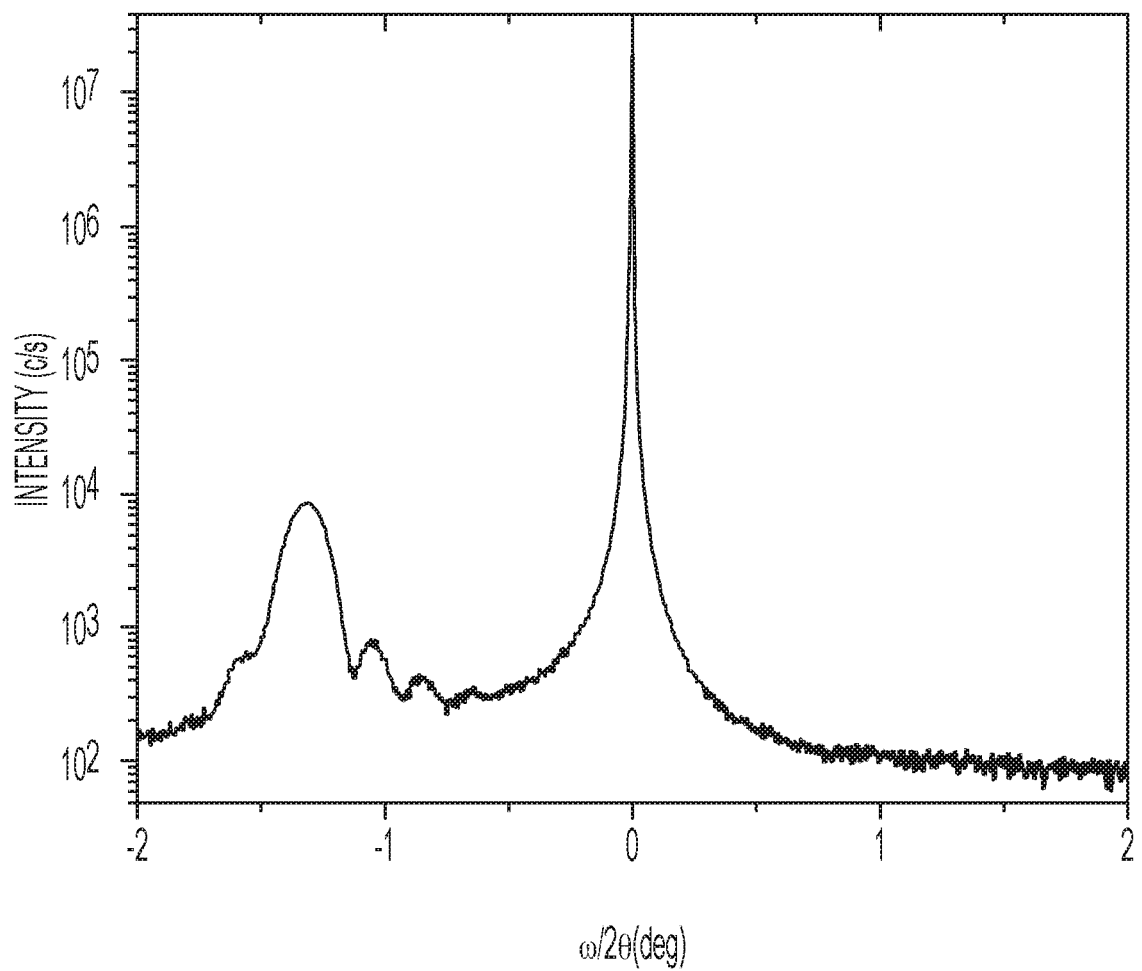
FIG. 1C is an high-resolution x-ray diffraction measurement for a third exemplary single-crystal phase change material, germanium-antimony telluride (Ge2Sb2Te5) according to an embodiment of the present invention.

A single-crystal material is typically analyzed by x-ray diffraction and FIGS. 1A-C are high-resolution x-ray diffractions of three different PCM films that were expitaxially grown over Si (111). In FIGS. 1A-C, $\omega$ is an angle between an incident beam and a sample surface and $2\theta_B$ is an angle between a detector (diffracted beam) and the incident beam (i.e., it is twice the Bragg angle $\theta_B$). As such, FIGS. 1A-C are high-resolution x-ray diffraction measurements that show a diffraction peak from the Si (111) substrate and an additional diffraction peak that originates from the single-crystal PCM layer. Furthermore, the diffraction plots also exhibit thickness fringes (pendellösung fringes) which indicates that the single-crystals are of high quality. The single-crystal structure of the PCM layer was further confirmed by high-resolution transmission electron microscopy (TEM) analysis.

The x-ray diffraction pattern for a first exemplary PCM, antimony telluride ($Sb_2Te_3$), is shown in FIG. 1A, the x-ray-diffraction pattern for a second exemplary PCM, germanium telluride (GeTe) is shown in FIG. 1B and the x-ray diffraction pattern for a third exemplary PCM, germanium-antimony telluride ($Ge_2Sb_2Te_5$) is shown in FIG. 1C. Each sample, a chalcogenide PCM, was formed on a Si (111) wafer. It is notable that the present techniques are not in any way limited to these particular PCMs, that FIGS. 1A-C merely demonstrate that the creation of a single-crystal PCM is possible and that these exemplary materials were chosen due to the materials having key properties that make them good material choices for data storage. Among these properties are: fast switching speed between the amorphous to crystalline phases and vice versa, long retention time (i.e., once the material is set to one of the phases it remains in that phase for a period of time measured in years), large resistivity ratio between amorphous and crystalline states which makes it easy to determine the material phase with an appropriate read circuitry.

Figure 1D:
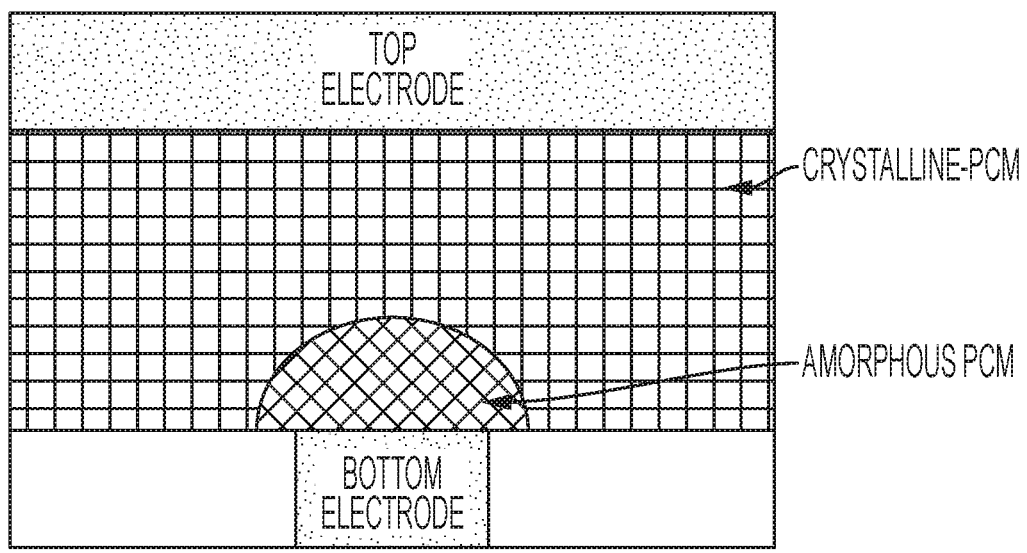
FIG. 1D is a schematic side view of a vertical phase change material device.

With reference to FIG. 1D, in a typical device structure, when PCM is converted to an amorphous state, a portion of the PCM can remain crystalline. It is notable that during cell operations all that is required is that the formed region of amorphous material will block (cover) one electrode. It is not necessary (or in this case desirable) to convert the entire layer of the phase change material to the amorphous state. Thus some of the material remains monocrystalline and serves as a template, such that the material will recrystallize as a single-crystal. It is notable that once the amorphous region covers one of the electrodes (in this case the bottom electrode), current flow stops. It is therefore the case that only the region adjacent to (in this case, the bottom) electrode changes to the amorphous phase.

Typically one of the device electrodes is designed to have a smaller contact area than the other electrode. The amorphous region will cap the smaller electrode since the current density will peak at the smaller electrode. Thus, the melting of PCM will initiate at the bottom electrode.

While PCM devices are vertically oriented, there remains a need for planar single-crystal PCM devices. As will be explained below the planar single-crystal PCM device is simpler to implement and does not require tight alignment as is the case in the vertical device between top and bottom contacts. Furthermore, layer transfer and bonding to another wafer as practiced with the vertical device are not needed.

Turning now to an overview of the aspects of the invention, one or more embodiments of the invention address the above-described shortcomings of the prior art by providing for fabrication of a planar single-crystal PCM device. The planar single crystal PCM device includes a dielectric layer above or below a PCM layer, first and second contacts disposed in a same plane within the dielectric layer. Current is directed between the first and second contacts in short current pulses so as to form amorphous-PCM in a region of the PCM layer, which is adjacent to one of the first and second contacts, and crystalline-PCM surrounding and in contact with the amorphous-PCM.

The above-described aspects of the invention address the shortcomings of the prior art by providing for a planar single crystal PCM device that can be integrated with a complementary metal-oxide semiconductor (CMOS) circuit element or another similar device or element.

Turning now to a more detailed description of aspects of the present invention, FIG. 2 is a flow diagram illustrating a method of fabricating a planar single-crystal PCM device. As shown in FIG. 2, the method includes disposing a dielectric layer above or below a PCM layer (501) and optionally interposing a resistive layer between the dielectric layer and the PCM layer (502). The method also includes disposing first and second contacts in a same plane within the dielectric layer (503). In addition, the method includes directing a short current pulse between the first and second contacts so as to form amorphous-PCM in a region of the PCM layer, which is adjacent to one of the first and second contacts, and crystalline-PCM surrounding and in contact with the amorphous-PCM (504) and directing a long current pulse between the first and second contacts so as to recrystallize the PCM (505). The method can also include integrating a CMOS circuit element into the planar single-crystal PCM device (506).

In accordance with embodiments of the present invention, the disposing of the first and second contacts of 503 can be accomplished by applying photoresist to portions of the dielectric layer where the first and second contacts are to be formed, exposing the photoresist through a mask that defines the contacts locations and shapes, develop the photoresist to expose portions of the dielectric layer, remove the exposed portions of the dielectric layer and depositing material of the first and second contacts into the resulting spaces. The first and second contacts can thus have at least two similar dimensions with the second contact having a larger dimension than the first contact (i.e., the second contact can have a larger width than the first contact). In accordance with further embodiments of the present invention, the disposing of the first and second contacts can include one of disposing a pair of elongate contacts on either side of the one of the first and second contacts and disposing a single contact as a partial ring about the one of the first and second contacts.

With reference to FIG. 3, the method of fabricating the planar single-crystal PCM device can include additional operations. As shown in FIG. 3, the method can include disposing a dielectric layer above or below a PCM layer (601), optionally interposing a resistive layer between the dielectric layer and the PCM layer (602) and extending an isolation element through at least the PCM layer (603). The method also includes disposing first and second pairs of first and second contacts in a same plane within the dielectric layer at first and second sides of the isolation element, respectively, such that the isolation element electrically isolates PCM devices from one another (604).

In addition, the method includes directing short and long current pulses between the first pair of the first and second contacts where the short current pulses form amorphous-PCM in a region of the PCM layer, which is adjacent to one of the first and second contacts, and crystalline-PCM surrounding and in contact with the amorphous-PCM at the first side of the isolation element and where the long current pulses recrystallize the PCM (605 and 606) and directing short and long current pulses between the second pair of the first and second contacts where the short current pulses form amorphous-PCM in a region of the PCM layer, which is adjacent to one of the first and second contacts, and crystalline-PCM surrounding and in contact with the amorphous-PCM at the second side of the isolation element and where the long current pulses recrystallize the PCM (607 and 608). The method can also include integrating a CMOS circuit element into the planar single-crystal PCM device (609).

Figure 4:
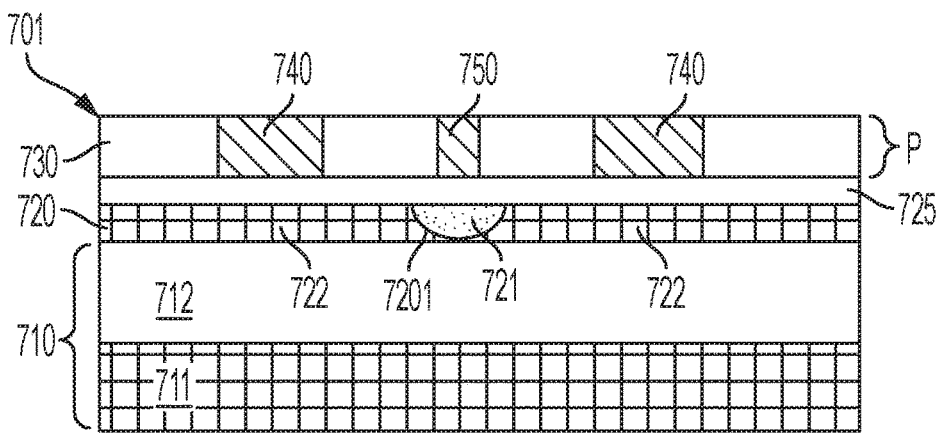
FIG. 4 is a cross-sectional view of a planar single-crystal phase change material device in accordance with embodiments of the present invention.

With reference to FIG. 4, a PCM device 701 is provided. The PCM device 701 includes a substrate 710, a PCM layer 720 disposed on the substrate 710, a dielectric layer 730 disposed over the PCM layer 720, a first contact 740 and a second contact 750. The first contact 740 and the second contact 750 are disposed in a same plane P within the dielectric layer 730 and the first contact 740 has a larger contact area than the second contact 750. In addition, following a direction of a short burst of current from the first contact 740 to the second contact 750, the PCM layer 720 can include amorphous-PCM 721 and crystalline-PCM 722. The amorphous-PCM 721 is provided in a PCM layer region 7201 that is adjacent to the second contact 750. This is due to the fact that there will be a larger current density in the PCM layer region 7201 than in PCM layer regions proximate to the first contact 740 owing to the larger contact area of the first contact 740. The crystalline-PCM 722 is disposed to surround and to be in contact with the amorphous-PCM 721. Following a direction of a long burst of current from the first contact 740 to the second contact 750, the amorphous-PCM 721 can be recrystallized in the PCM layer region 7201 such that an entirety of the PCM layer 720 is provided as crystalline PCM.

For purposes of clarity and brevity, it will be understood that the following description will relate to the case in which the amorphous-PCM 721 is provided in the PCM layer region adjacent to the second contact 750.

In greater detail, the formation of the amorphous-PCM 721 in the PCM layer region 7201 adjacent to the second contact 750 can be achieved by applying a large magnitude but short current pulse from the first contact 740 to the second contact 750 (this large magnitude but short current pulse can be referred to as a "RESET" pulse). As noted above, with the current density being largest at or near to the second contact 750 since the second contact 750 has a smaller contact area than the first contact 740, providing the RESET current pulse from the first contact 740 to the second contact 750 will melt quench the PCM layer 720 at the PCM layer region 7201 adjacent to the second contact 750. This will result in the formation of the amorphous-PCM 721 with the surrounding crystalline-PCM 722.

In accordance with embodiments of the invention, the amorphous-PCM 721 will be expected to remain or persist (at room temperature) for a residency of 10 years or more. This period of time is typically referred to as the device retention time.

The substrate 710 can include a semiconductor layer 711 and a dielectric substrate layer 712. The semiconductor layer 711 can include silicon (111), for example, and the dielectric substrate layer 712 can include silicon dioxide. The dielectric layer 730 can include silicon nitride. A resistive layer 725 can be interposed between the PCM layer 720 and the dielectric layer 730. The resistive layer 725 can include a carbon layer or a tantalum nitride (TaN) layer.

In accordance with further embodiments of the present invention, the PCM layer 720 can include or be provided as a single-crystal PCM layer 720 that is templated from a single-crystal substrate. In these or other cases, the PCM device 701 would be a planar single-crystal PCM device 701.

Figure 5:
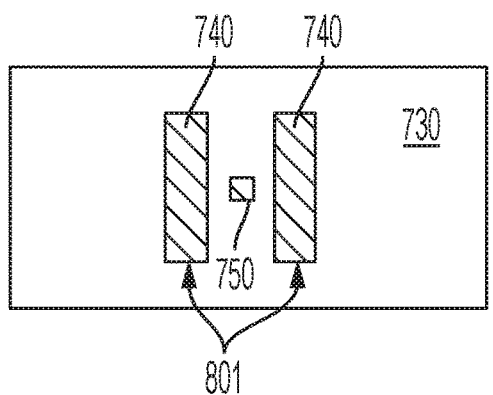
FIG. 5 is a top-down view of the device of FIG. 4.
Figure 6:
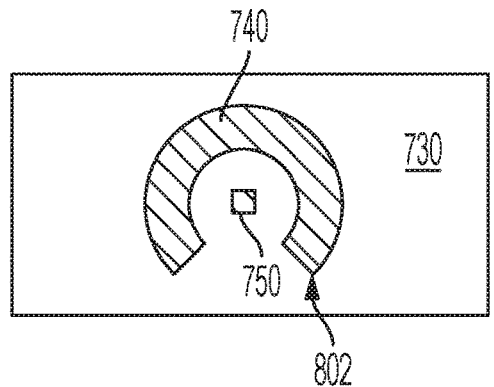
FIG. 6 is a top-down view of the device of FIG. 4.

With continued reference to FIG. 4 and with additional reference to FIGS. 5 and 6, the contact area of the first contact 740 is larger than a corresponding contact area of the second contact 750. For example, as shown in FIG. 4, a width of the first contact 740 can be greater than a width of the second contact 750. Moreover, as shown in FIGS. 5 and 6, the first contact 740 can be provided as one of a pair or a plurality of elongate first contacts 801 on either side of the second contact 750 (see FIG. 5) and as one or more single partial ring-shaped first contacts 802 disposed about the second contact 750 to surround the second contact 750 (see FIG. 6).

Figure 7:
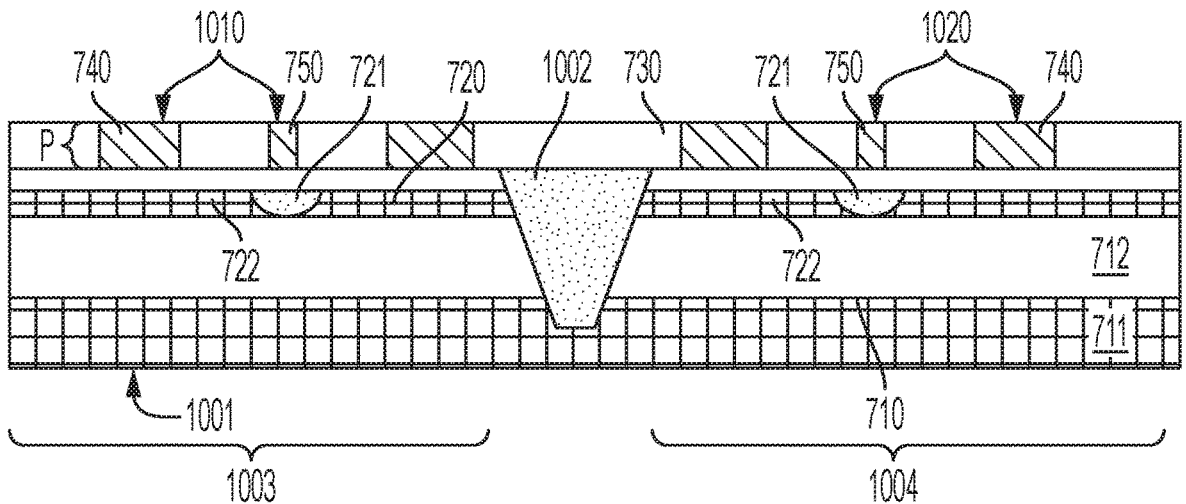
FIG. 7 a side view of a planar single-crystal phase change material device in accordance with embodiments of the present invention.

With reference to FIG. 7 and in accordance with further embodiments of the invention, a planar PCM device 1001 or a planar single-crystal PCM device 1001 is provided. The PCM device 1001 is similar to the PCM device 701 of FIG. 4 but includes an isolation element 1002 extending through the PCM layer 720 and the substrate 710 to define first and second sides 1003 and 1004. In these or other cases, the first and second contacts 740 and 750 can be provided as a first pair 1010 of the first and second contacts 740 and 750 and as a second pair 1020 of the first and second contacts 740 and 750 in the same plane P on the first and second sides 1003 and 1004 of the isolation element 1002, respectively. As above, the PCM layer 720 can include, at each of the first and second sides 1003 and 1004 of the isolation element 1002, amorphous-PCM 721 in respective PCM layer regions adjacent to the second contacts 750 of each of the first and second pairs 1010 and 1020 and crystalline-PCM 722 surrounding and in contact with the amorphous-PCM 721.

The details of FIG. 7 serve to demonstrate the isolation between two adjacent PCM devices 701. Additional isolation structures can be used to provide isolation between pluralities of PCM devices 701 that are fabricated on the same wafer (not shown).

Figure 8:
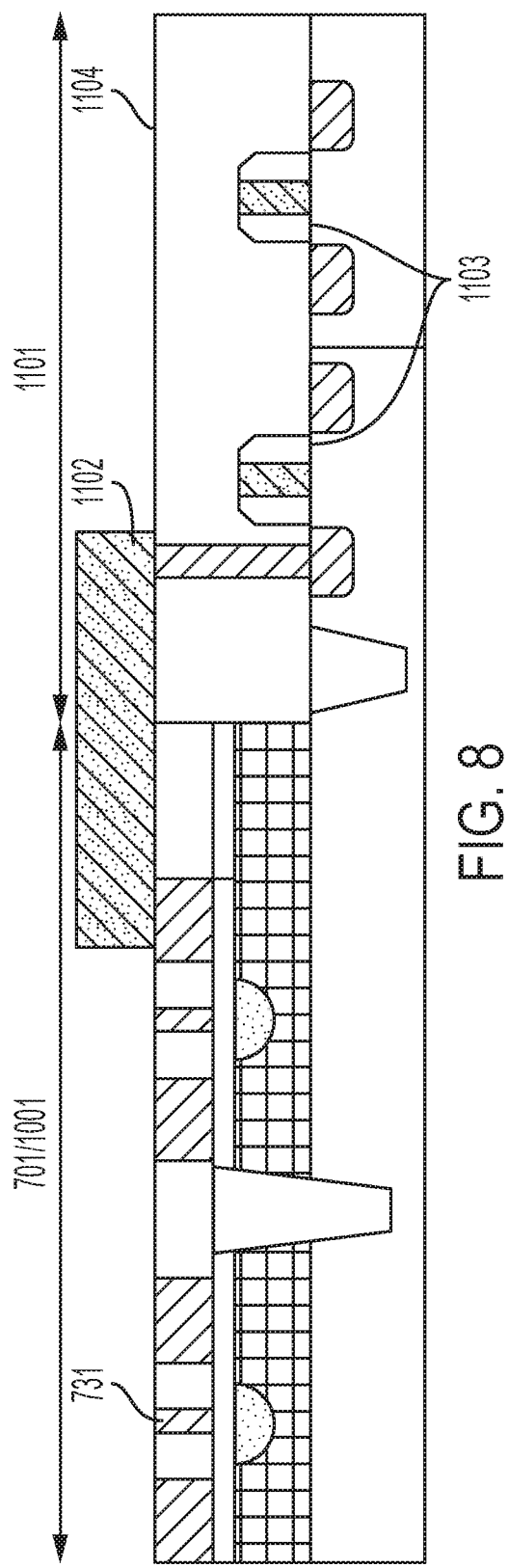
FIG. 8 is a side view of a planar single-crystal phase change material device in accordance with further embodiments of the present invention.

With reference to FIG. 8 and in accordance with still further embodiments of the invention, a CMOS circuit element 1101 can be provided along with the PCM device 701 or 1001 of FIG. 4 or 7. In these or other cases, the CMOS circuit element 1101 can be electrically coupled with the PCM device 701/1001 by way of metallization element 1102 and can include one or more electronic devices 1103. In any case, the CMOS circuit element 1101 can be disposed at a side of the PCM device 701 or 1001 with planarization of at least an upper surface thereof 1104 with at least an upper surface 731 of the dielectric layer 730.

Figure 9:
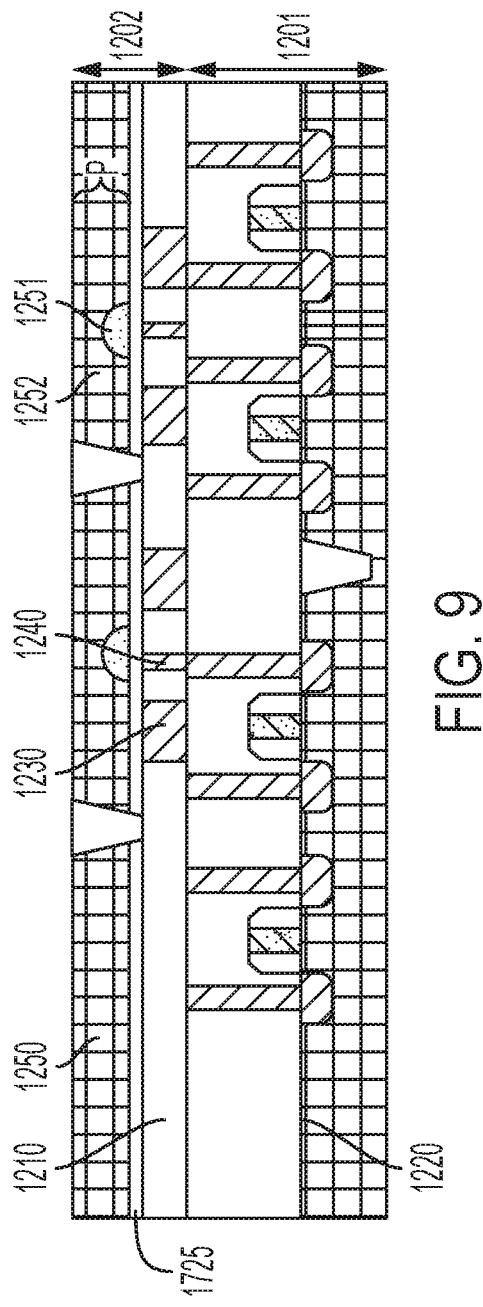
FIG. 9 is a side view of a planar single-crystal phase change material device in accordance with further embodiments of the present invention.

With reference to FIG. 9 and in accordance with still further embodiments of the invention, CMOS circuit element 1201 can be provided in a vertical stack with the PCM device 701 or 1001 of FIG. 4 or 7. In these or other cases, the resulting device can include the PCM device 701 or 1001 as described above or a planar single-crystal PCM device 1202 in which a dielectric layer 1210 is disposed over a substrate 1220, first and second contacts 1230 and 1240 are disposed in a same plane P within the dielectric layer 1210 and a PCM layer 1250 is disposed over the dielectric layer 1201. The PCM layer 1250 can include amorphous-PCM 1251 in a PCM layer region that is adjacent to the second contact 1240 and crystalline-PCM 1252 surrounding and in contact with the amorphous-PCM 1251.

We further note that the PCM device shown in FIG. 9 is inverted with respect to the PCM devices 701 or 1001. By "inverted" we mean that the PCM device contacts 1230 and 1240 are formed under the PCM layer 1250. As is the case with PCM devices 701 and 1001, a resistive layer 1725 may be inserted between the PCM layer 1250 and dielectric layer 1210.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a phase change material (PCM) device, the method comprising:
   disposing a dielectric layer and a PCM layer;
   disposing first and second contacts in a same plane within the dielectric layer with the first contact having a larger contact area than the second contact, wherein the PCM layer extends over and beyond a combined width of the first and second contacts and portions of the dielectric layer interposed between the first and second contacts; and
   one of:
   directing a short current pulse from the first contact to the second contact so as to form amorphous-PCM in a region of the PCM layer adjacent to the second contact with crystalline-PCM partially surrounding and in contact with the amorphous-PCM, and
   directing a long current pulse from the first contact to the second contact so as to form crystalline-PCM in the region of the PCM layer adjacent to the second contact, wherein the method further comprises interposing a resistive layer between the PCM layer and the first and second contacts and the dielectric layer with which the first and second contacts are coplanar.

2. The method according to claim 1, wherein the disposing of the first contact comprises one of:
   disposing a plurality of first contacts on either side of the second contact; and
   disposing one or more first contacts to surround the second contact.

3. The method according to claim 1, wherein a plurality of PCM devices are fabricated and are isolated from each other by an isolation element.

4. The method according to claim 1, further comprising integrating a complementary metal-oxide semiconductor (CMOS) circuit element into the PCM device.

5. A method of fabricating a phase change material (PCM) device, the method comprising:
   disposing a dielectric layer and a PCM layer;
   disposing first and second contacts in a same plane within the dielectric layer with the first contact having a larger contact area than the second contact, wherein the PCM layer extends over and beyond a combined width of the first and second contacts and portions of the dielectric layer interposed between the first and second contacts; and
   one of:
   directing a short current pulse from the first contact to the second contact so as to form amorphous-PCM in a region of the PCM layer adjacent to the second contact with crystalline-PCM partially surrounding and in contact with the amorphous-PCM, and
   directing a long current pulse from the first contact to the second contact so as to form crystalline-PCM in the region of the PCM layer adjacent to the second contact, wherein the PCM layer is templated from a crystal structure of a substrate comprising:
   a semiconductor layer; and
   a dielectric substrate layer interposed between the PCM layer and the semiconductor layer.

6. A phase change material (PCM) device, comprising:
   a substrate;
   a PCM layer disposed on the substrate;
   a dielectric layer disposed over the PCM layer; and
   first and second contacts disposed in a same plane within the dielectric layer with the first contact having a larger contact area than the second contact, wherein the PCM layer extends over and beyond a combined width of the first and second contacts and portions of the dielectric layer interposed between the first and second contacts, the PCM layer comprising one of:
   amorphous-PCM in a PCM layer region adjacent to the second contact and crystalline-PCM surrounding and in contact with the amorphous-PCM following a short current pulse being directed from the first contact to the second contact, and
   crystalline-PCM in the PCM layer region following a long current pulse being directed from the first contact to the second contact,
   wherein the PCM device further comprises a resistive layer interposed between the PCM layer and the first and second contacts and the dielectric layer with which the first and second contacts are coplanar.

7. The PCM device according to claim 6, wherein the substrate comprises:
   silicon (111); and
   a dielectric substrate layer interposed between the PCM layer and the silicon (111).

8. The PCM device according to claim 6, wherein the first contact is provided as one of:
   a plurality of first contacts on either side of the second contact; and
   one or more first contacts surrounding the second contact.

9. The PCM device according to claim 6, wherein the PCM layer comprises a single-crystal PCM layer.

10. The PCM device according to claim 6, further comprising a complementary metal-oxide semiconductor (CMOS) circuit element planarized with an upper surface of the dielectric layer.

11. The PCM device according to claim 6, wherein the PCM device is provided as a plurality of PCM devices electrically isolated from one another by an isolation element extending through the PCM layer.

12. The PCM device according to claim 6, wherein the PCM layer and the substrate are each single-crystal and related to each other.

13. A phase change material (PCM) device, comprising:
   a substrate;
   a dielectric layer disposed over the substrate;
   first and second contacts disposed in a same plane within the dielectric layer with the first contact having a larger contact area than the second contact; and
   a PCM layer disposed over the dielectric layer, wherein the PCM layer extends over and beyond a combined width of the first and second contacts and portions of the dielectric layer interposed between the first and second contacts and the PCM layer comprising one of:
   amorphous-PCM in a PCM layer region adjacent to the second contact and crystalline-PCM surrounding and in contact with the amorphous-PCM following a short current pulse being directed from the first contact to the second contact, and
   crystalline-PCM in the PCM layer region following a long current pulse being directed from the first contact to the second contact,
   wherein the PCM device further comprises a resistive layer interposed between the PCM layer and the first and second contacts and the dielectric layer with which the first and second contacts are coplanar.

14. The PCM device according to claim 13, wherein the first contact is provided as one of:
  a plurality of first contacts on either side of the second contact, and
  one or more first contacts surrounding the second contact.

15. The PCM device according to claim 13, further comprising a complementary metal-oxide semiconductor (CMOS) circuit element interposed between the substrate and the dielectric layer.

16. The PCM device according to claim 13, wherein the PCM device is provided as a plurality of PCM devices electrically isolated from one another by an isolation element extending through the PCM layer.

* * * * *